United States Patent [19]
Fujiwara

[11] Patent Number: 6,159,282
[45] Date of Patent: Dec. 12, 2000

[54] METHOD OF PULLING A SINGLE CRYSTAL

[75] Inventor: Hideki Fujiwara, Osaka, Japan

[73] Assignee: Sumitomo Metal Industries, Ltd., Osaka, Japan

[21] Appl. No.: 09/242,829

[22] PCT Filed: Aug. 29, 1997

[86] PCT No.: PCT/JP97/03015

§ 371 Date: Dec. 9, 1999

§ 102(e) Date: Dec. 9, 1999

[87] PCT Pub. No.: WO98/09007

PCT Pub. Date: Mar. 5, 1998

[30] Foreign Application Priority Data

Aug. 30, 1996 [JP] Japan ................................. 8-249155
Sep. 17, 1996 [JP] Japan ................................. 8-266755

[51] Int. Cl.[7] .................................................. C30B 15/26

[52] U.S. Cl. ................................ 117/13; 117/14; 117/15; 117/35

[58] Field of Search ................................... 117/201, 208, 117/218, 911, 932, 13–15, 35

[56] References Cited

U.S. PATENT DOCUMENTS

| 5,126,113 | 6/1992 | Yamagishi et al. | 117/218 |
|---|---|---|---|
| 5,378,900 | 1/1995 | Hirano et al. | 117/201 |
| 5,665,159 | 9/1997 | Fuerhoff | 117/201 |
| 5,843,229 | 12/1998 | Kumara et al. | 117/218 |
| 5,935,321 | 8/1999 | Chiou et al. | 117/13 |

FOREIGN PATENT DOCUMENTS

| 61-122187 | 6/1986 | Japan . |
|---|---|---|
| 63-252991 | 10/1988 | Japan . |
| 3-285893 | 12/1991 | Japan . |
| 58-135197 | 8/1993 | Japan . |

Primary Examiner—Benjamin L. Utech
Assistant Examiner—Donald L. Champagne
Attorney, Agent, or Firm—Wenderoth, Lind & Ponack, L.L.P.

[57] ABSTRACT

A method of pulling a single crystal includes forming an enlarged portion 26b and a reduced portion 26c under a neck 26a, and fitting the reduced portion for pulling an upsized single crystal. The reduced portion is formed with angle $\theta_s$ so that the diameter can be measured at all times using an optical measuring means 19 with optical axis angle $\theta_m$, such that $\theta_s > \theta_m$.

4 Claims, 8 Drawing Sheets

METHOD OF PULLING A SINGLE CRYSTAL

TECHNICAL FIELD

The present invention relates to a method of pulling a single crystal and, more particularly, to a method of pulling a single crystal wherein a single crystal of silicon or the like is pulled from a melt of a material for forming a single crystal by a pulling method such as the Czochralski method (hereinafter, referred to as the CZ method).

BACKGROUND ART

Figure 1:
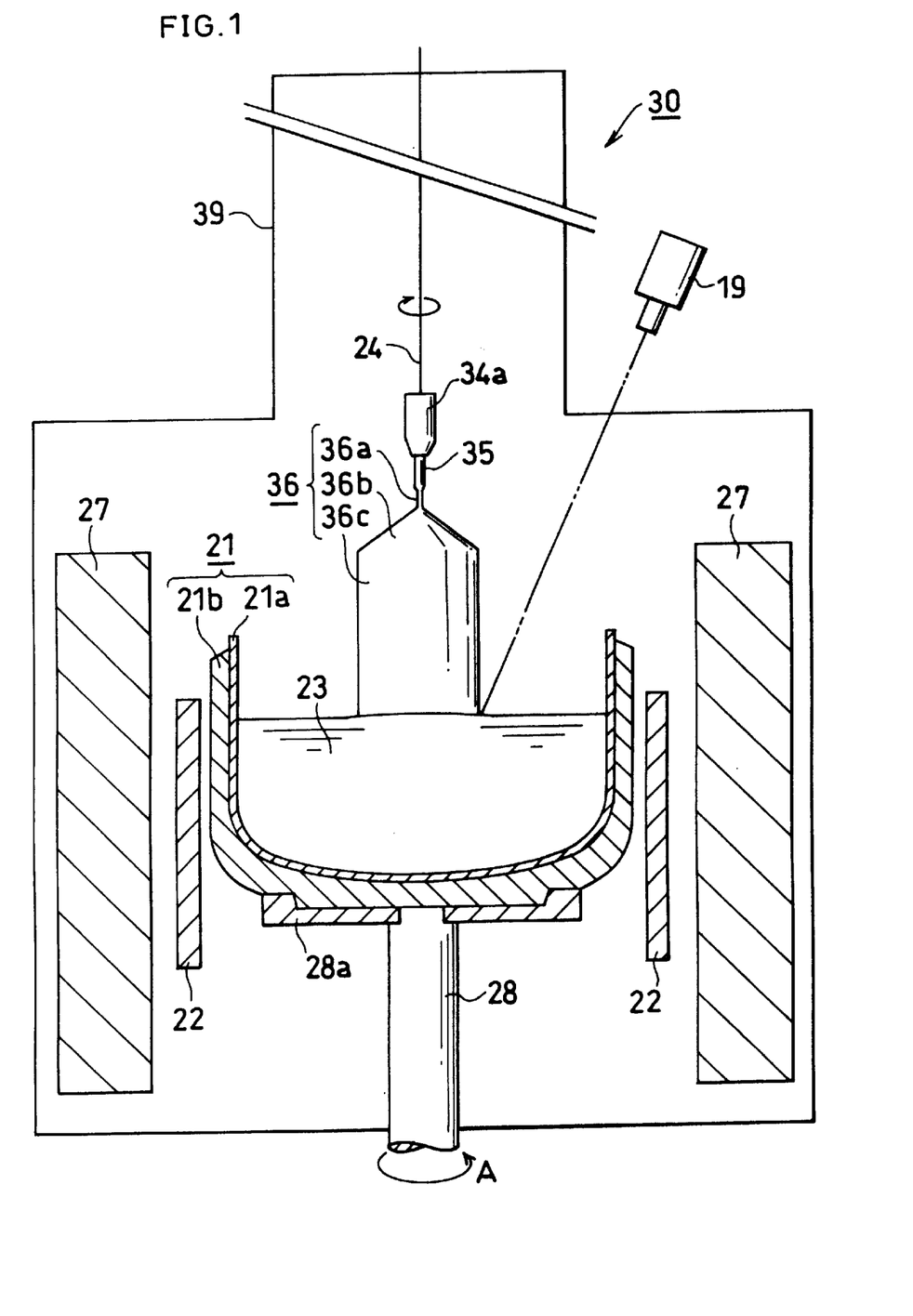
FIG. 1 is a diagrammatic sectional view showing a conventional apparatus for pulling a single crystal.

At present, the majority of silicon single crystals used for manufacturing a substrate for forming a circuit component of a LSI (large scale integrated circuit) and the like have been pulled by the CZ method. FIG. 1 is a diagrammatic sectional view of a conventional apparatus for pulling a single crystal using the CZ method. In the figure, reference numeral 21 represents a crucible.

The crucible 21 comprises a bottomed cylindrical quartz crucible 21a and a bottomed cylindrical graphite crucible 21b fitted on the outer side of the quartz crucible 21a. The graphite crucible 21b is fitted in a graphite fitting part 28a. The crucible 21 and the fitting part 28a are supported with a support shaft 28 which rotates in the direction shown by the arrow A in the figure at a prescribed speed. A heater 22 of a resistance heating type and a heat insulating mold 27 arranged around the heater 22 are concentrically arranged around the crucible 21. The crucible 21 is charged with a melt 23 of a material for forming a crystal which is melted by the heater 22. On the central axis of the crucible 21, a pulling axis 24 made of a pulling rod or wire is suspended, and at the lower end thereof, a seed crystal 35 is held by a holder 34a. These parts are arranged within a water cooled type chamber 39 wherein pressure can be controlled, while an optical measuring means 19 is arranged above the crucible 21 outside the chamber 39.

In pulling a single crystal 36 using the above-mentioned apparatus for pulling a single crystal 30, the pressure in the chamber 39 is reduced and an inert gas is introduced into the chamber 39 so as to make an inert gas atmosphere under reduced pressure, which is maintained for a period of time. Then, the material for forming a crystal is melted by the heater 22.

While the pulling axis 24 is rotated on the same axis in the reverse direction of the support shaft 28 at a prescribed speed, the seed crystal 35 held by the holder 34a descends and is brought into contact with the melt 23, and the pulling of the single crystal 36 from the melt 23 is started. When the crystal is made to grow at the lower end portion of the seed crystal 35 as the pulling is carried out, the crystal is once narrowed down to have a prescribed diameter, leading to the formation of a neck 36a (hereinafter, referred to as the necking step).

After forming a shoulder 36b by making the neck 36a grow to have a prescribed diameter, a main body 36c having a uniform diameter and a prescribed length is formed. The diameter of the single crystal 36 is gradually decreased and the temperature of the whole single crystal 36 is gradually lowered, leading to the formation of an end-cone. Then, the single crystal 36 is separated from the melt 23. Here, in the above steps, the diameter of the single crystal 36 is measured by measuring luminance of the growth interface (fusion ring) on the surface of the melt 23 when the single crystal 36 is formed, using the optical measuring means 19, and is controlled on the basis of the results.

In the above conventional method for pulling a single crystal, the neck 36a is formed under the seed crystal 35 in order to exclude the dislocation induced by a thermal shock when the seed crystal 35 is brought into contact with the melt 23. Ordinarily, the neck 36a has a diameter of 3 mm or so and a length of 30 mm or so. In pulling a single crystal 36 having a diameter of about 6 inches and a weight of 80 kg or so, even the neck 36a having the above diameter can sufficiently support the pulled single crystal 36.

Recently, however, in order to manufacture a more highly integrated semiconductor device at a lower cost and more efficiently, the wafer has been required to have a larger diameter. Now, for example, the production of the single crystal 36 having a diameter of about 12 inches (300 mm) and a weight of 300 kg or so is desired. In this case, the neck 36a having a conventional diameter(usually 3 mm or so) cannot withstand the weight of the pulled single crystal 36 and breaks, resulting in the failing of the single crystal 36.

In order to solve the above problem, a method for pulling a single crystal has been disclosed. The diameter of the single crystal is gradually enlarged once under the neck to form an enlarged portion. The diameter of the crystal is gradually reduced to form a reduced portion having a larger diameter than the neck, which is supported by a supporting apparatus when the single crystal is pulled.

Figure 2:
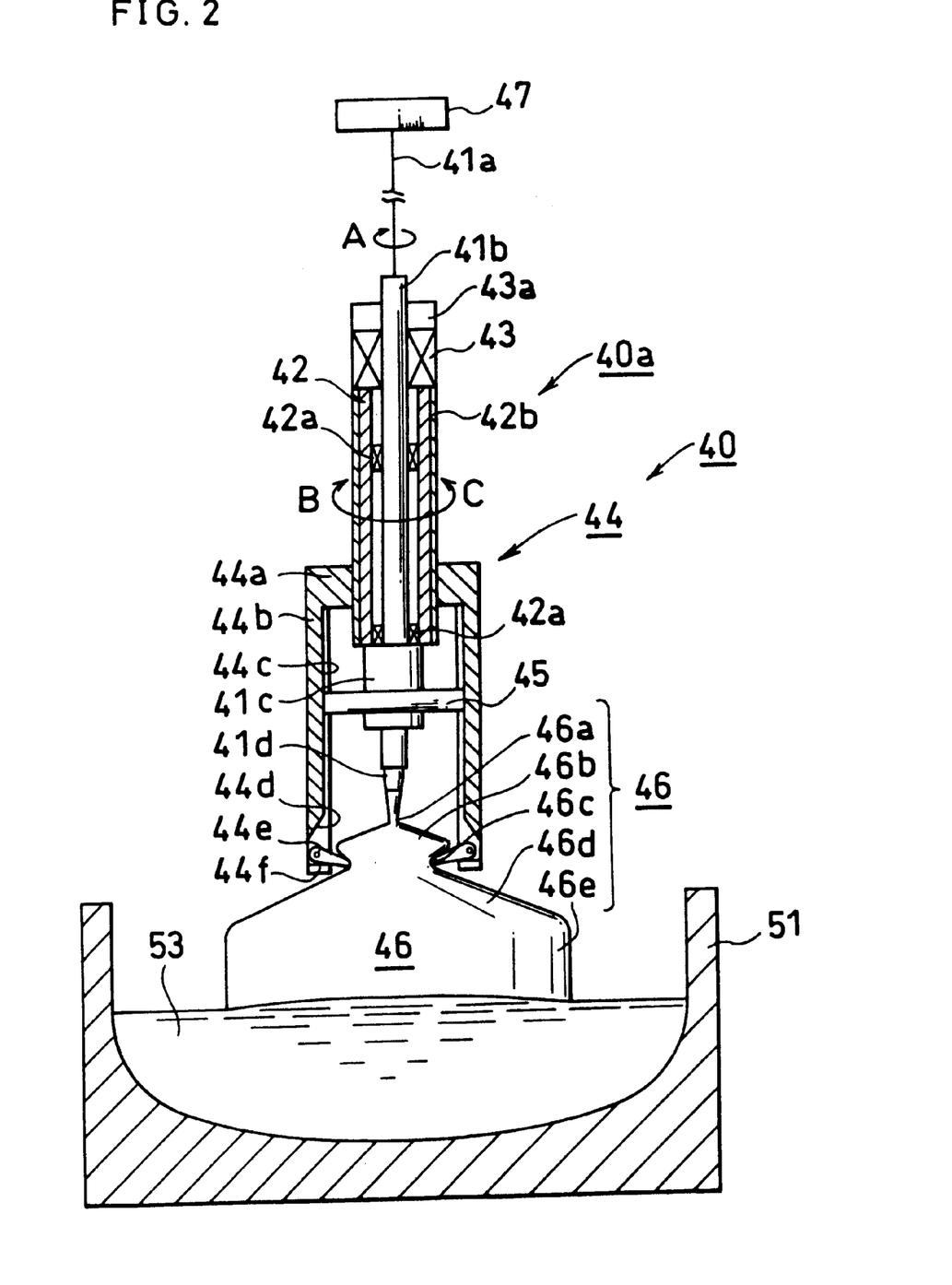
FIG. 2 is a diagrammatic sectional view showing another conventional apparatus for pulling a single crystal.

FIG. 2 is a diagrammatic sectional view of a conventional apparatus for pulling a single crystal including such kind of single crystal supporting apparatus (Japanese Patent Publication No.515/95), and in the figure, reference numeral 51 represents a crucible.

The bottom, almost cylindrical crucible 51 is charged with a melt 53 of a material for forming a single crystal. A pulling wire 41a is suspended above the crucible 51, and is caused to move up and down and to rotate in the direction shown by the arrow A by a wire actuator 47. To the lower end portion of the pulling wire 41a, a bar-shaped pulling axis 41b is joined, around which a pipe-shaped rotor 42 is arranged by a bearing 42a so as to be rotatable. To the upper portion of the pulling axis 41b, a motor 43 is fitted, and the motor 43 is connected to the upper portion of the rotor 42 and is electrically joined to a receiving portion 43a. When a signal transmitted from the outside of a chamber (not shown) of an apparatus for pulling a single crystal 40 using a transmitting means (not shown) is received by the receiving portion 43a, the motor 43 is driven so as to rotate the rotor 42 in the direction shown by the arrow B or C. On the outer regions of the rotor 42, an external thread portion 42b is formed, to which a disc-shaped supporting portion 44a is screwed. From the lower portion of the supporting portion 44a, a cylindrical grasping holder 44b is extended, and on the inner surface thereof, guide slots 44c are vertically formed so as to face each other. In the lower portion of the grasping holder 44b, plural notches 44d are formed, in which pawls 44e are pivoted so as to be rotatable. At the lower end portion of the grasping holder 44b, a stopper portion 44f is formed. Accordingly, the pawls 44e can turn upward, while they are inhibited from turning downward by the stopper portion 44f. A grasping means 44 includes the supporting portion 44a, grasping holder 44b, pawls 44e, stopper portion 44f, and associated parts. On the other hand, a holder 41c is connected to the lower end portion of the pulling axis 41b, and a flange 45 is fixed to the outer regions of the holder 41c. The outer regions of the flange 45 are fitted in the guide slots 44c so as to slide up and down. When the rotor 42 rotates, the grasping means 44 moves up and down as the rotation thereof is restricted. A single crystal supporting apparatus 40a includes the pulling axis 41b, rotor 42, motor 43, grasping means 44, flange 45, and associated parts. At the lower end portion of the holder 41c, a seed crystal 41d is held.

In pulling a single crystal 46 using the apparatus for pulling a single crystal 40 having the above construction, the motor 43 is driven in the normal direction of rotation so as to rotate the rotor 42 (for example, in the direction of the arrow B) and to transfer upward the grasping means 44 which is screwed thereto. The wire actuator 47 is driven so as to transfer the holder 41c downward through the pulling wire 41a and pulling axis 41b to dip the seed crystal 41d into the melt 53. The wire actuator 47 is driven so as to pull the pulling wire 41a with rotation at a relatively high speed, leading to the formation of a neck 46a. By pulling the pulling wire 41a away from the melt at a gradually decreased speed, an enlarged portion 46b having a large diameter is formed under the neck 46a. By pulling the pulling wire 41a at a relatively high speed again, a reduced portion 46c having a smaller diameter than the enlarged portion 46b is formed under the enlarged portion 46b. By pulling the pulling wire 41a at a gradually decreased speed, a shoulder portion 46d is formed under the reduced portion 46c. At that time, by transmitting a signal to the receiving portion 43a using the above transmitting means, the motor 43 is driven in the reverse direction of rotation so as to rotate the rotor 42 in the direction of the arrow C to transfer the grasping means 44 downward. When the pawls 44e touch the enlarged portion 46b, the pawls 44e are caused to turn relatively upward so as to avoid the enlarged portion 46b and are fitted to the reduced portion 46c. When the pulling wire 41a is pulled at a prescribed speed after the motor 43 is stopped, a main body 46e having a prescribed diameter is formed under the shoulder portion 46d where the reduced portion 46c is held by the single crystal supporting apparatus 40a.

To separate the grown single crystal 46 from the melt 53, the pulling wire 41a is pulled at a relatively high speed so as to gradually reduce the crystal diameter to form an inverse conical crystal tail (not shown), and the single crystal 46 is separated from the melt 53 at a point of time when the single crystal 46 has a sufficiently small diameter to prevent dislocation from propagating to a product portion even if the dislocation occurs. This step has been adopted in order to prevent the dislocation from being caused by a thermal shock and from propagating to the main body 46e which forms the product portion.

The above apparatus for pulling a single crystal 40 makes it possible to pull an upsized single crystal 46. However, when the diameter is controlled using the optical measuring means 19 in the same manner as in the case using the conventional apparatus for pulling a single crystal 30, the growth interface is hidden by the enlarged portion 46b in the formation of the reduced portion 46c, so that the fusion ring cannot be observed. Therefore, it is difficult to control the diameter of the single crystal 46 using the optical measuring means 19 in the formation of the reduced portion 46c, and, thus, it is difficult to form the reduced portion 46c having a prescribed shape. Since it is difficult to control the shape of the reduced portion 46c, it is difficult to cope with changes in the conditions such as the temperature of the melt 53, so that dislocation is easily induced to the reduced portion 46c.

The conventional apparatus for pulling a single crystal 40 (FIG. 2) by which the single crystal 46 is pulled as the reduced portion 46c is held, has a complicated structure. Since the complicated single crystal supporting apparatus 40a must be arranged in a high temperature atmosphere just above the melt 53, troubles are easily caused.

Another apparatus for pulling a single crystal has been disclosed. In this apparatus, a structure for holding a reduced portion and a pulling axis for pulling a single crystal individually ascend and descend. However, in such apparatus, it is difficult to synchronize the ascent/descent speed and the number of revolutions, and it is also difficult to certainly hold a single crystal when the central axis even slightly slips out of place.

Since the single crystal supporting apparatus 40a, forming part of the apparatus for pulling a single crystal 40, has a construction wherein the reduced portion 46c is grasped by the pawls 44e, the fitting strength is small and the pawls 44e are easy to break.

SUMMARY OF THE INVENTION

The present invention was developed in order to solve the above problems. It is object of the present invention to provide a method of pulling a single crystal, wherein the diameter can be stably controlled in the formation of a reduced portion of a single crystal.

In order to achieve this object, a method of pulling a single crystal according to the present invention is provided. A single crystal is pulled as the diameter thereof on the melt interface is measured using an optical measuring means arranged above a crucible. Thus, the diameter of the crystal can be controlled. This method includes a necking step wherein a neck is formed under a seed crystal by rotating the seed crystal after dipping the seed crystal into the melt within the crucible. The method further includes an enlarged portion formation step wherein the diameter of the single crystal is gradually increased once after the necking step, and a reduced portion formation step wherein the diameter of the single crystal is gradually reduced after the enlarged portion formation step so as to form a reduced portion. Thus, the instant method is particularly characterized by forming the reduced portion so that the relationship $\theta_s > \theta_m$ holds when the optical axis of the optical measuring device and a horizontal plane make an angle $\theta_m$, and when a straight line forming the surface of the reduced portion and a horizontal plane make an angle $\theta_s$. In addition, the diameter of the reduced portion is measured at all times using the optical measuring means.

In the method of pulling a single crystal the diameter is measured at all times through the fusion ring in the formation of the reduced portion, so that the shape of the reduced portion can be controlled precisely. Therefore, it is possible to accurately cope with even a change in the temperature of the melt or the like. As a result, dislocation is not induced in the formation of the reduced portion, so that a single crystal containing no fault such as dislocation can be pulled from the melt.

DETAILED DESCRIPTION OF THE INVENTION

The embodiments of the method of pulling a single crystal according to the present invention are described below by reference to the Figures of the drawings. The method of pulling a single crystal according to the present invention are described on the assumption that a heavy single crystal having a large diameter of 12 inches or more is pulled.

Figure 3:
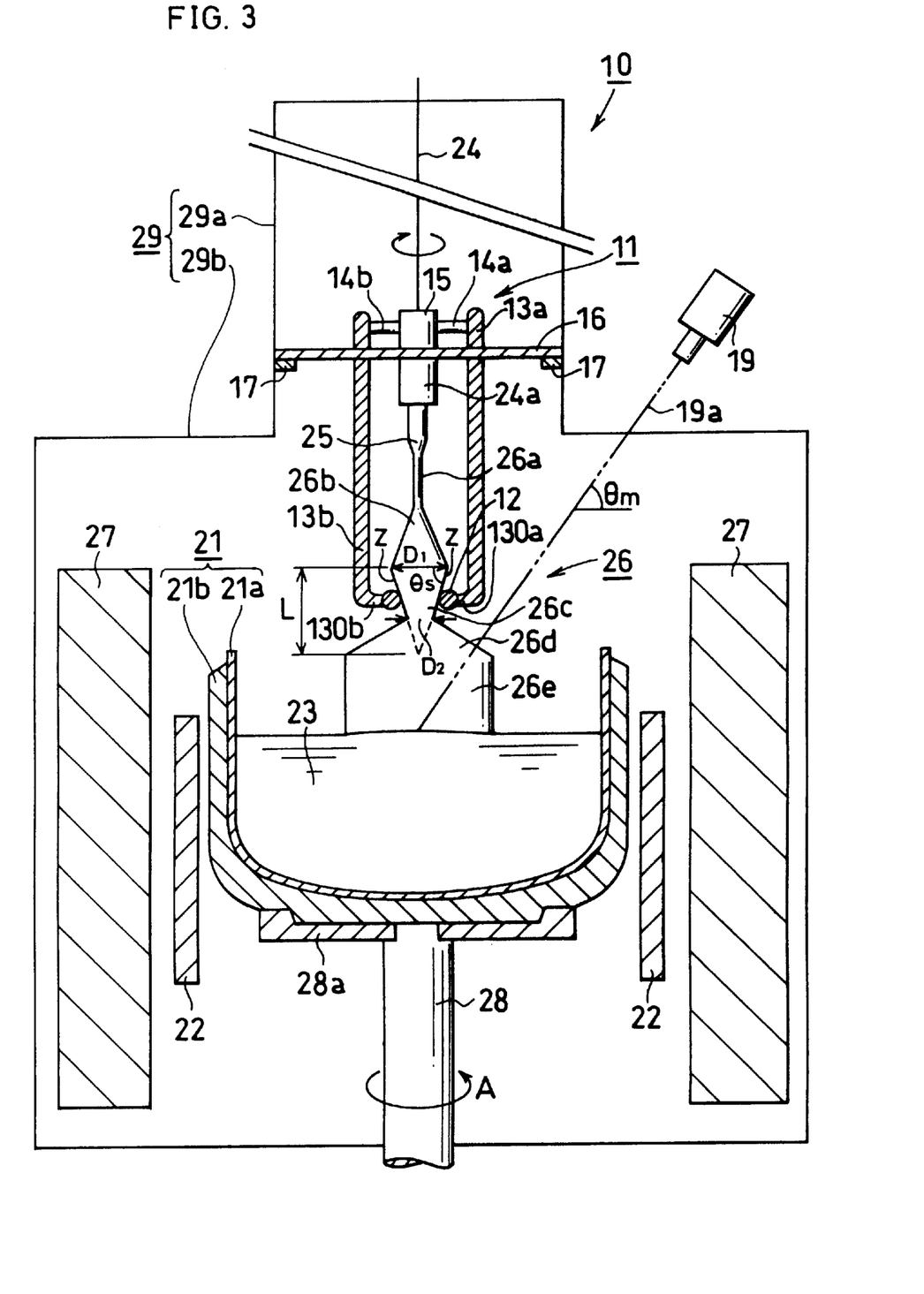
FIG. 3 is a longitudinal sectional view diagrammatically showing an apparatus for pulling a single crystal according to an embodiment of the present invention.
Figure 4:
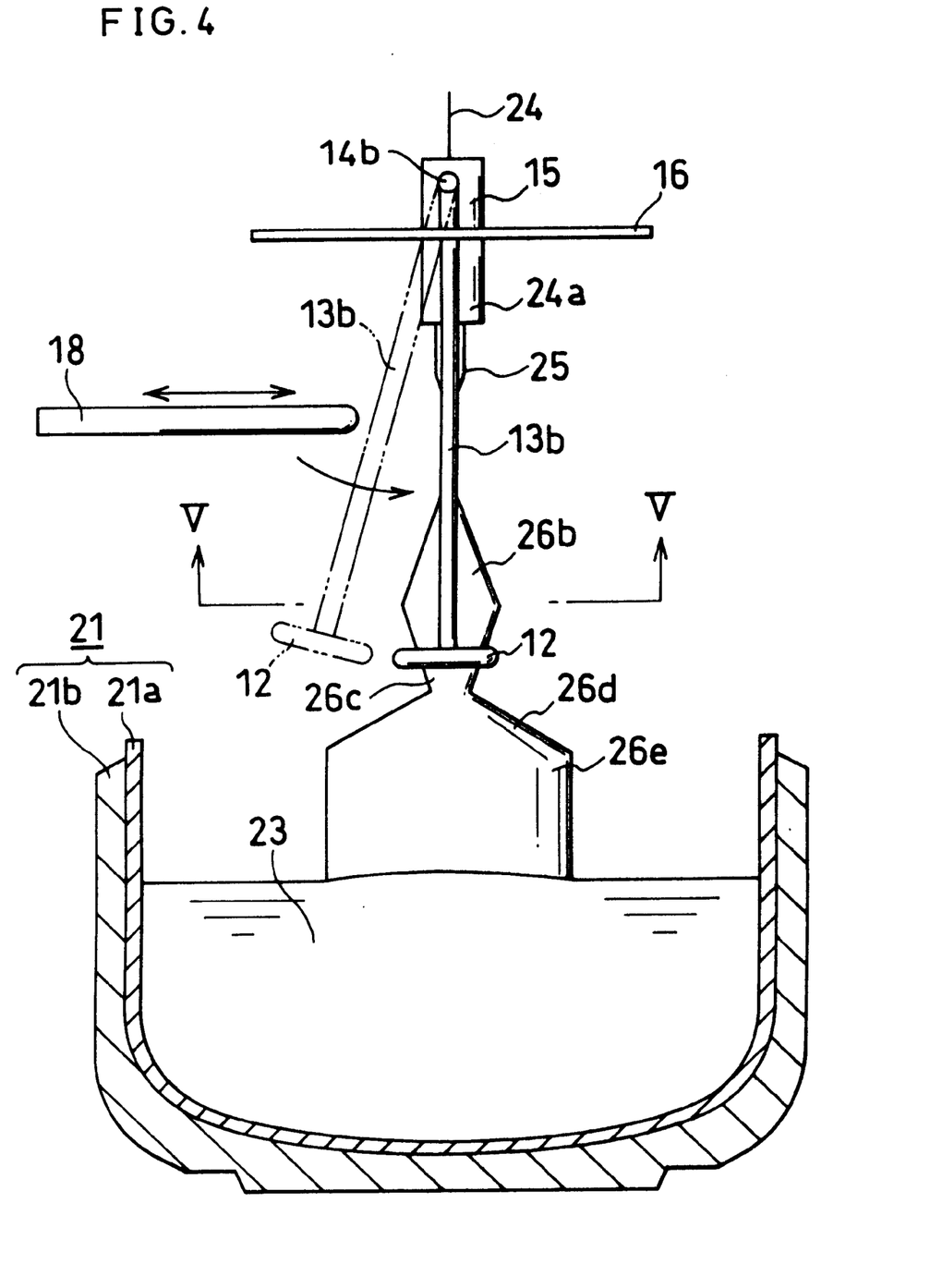
FIG. 4 is a partial sectional side view diagrammatically showing a single crystal holding means which forms part of the apparatus for pulling a single crystal and the vicinity thereof according to the embodiment.
Figure 5:
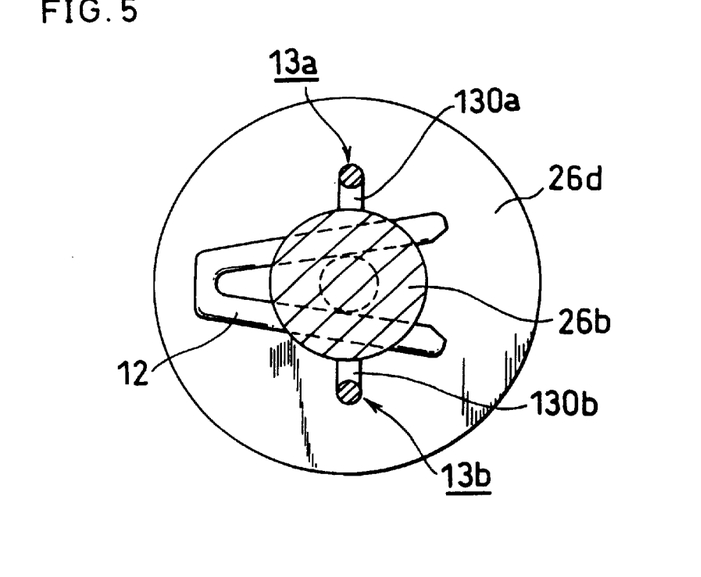
FIG. 5 is a sectional view along line V—V of FIG. 4.
Figure 6:
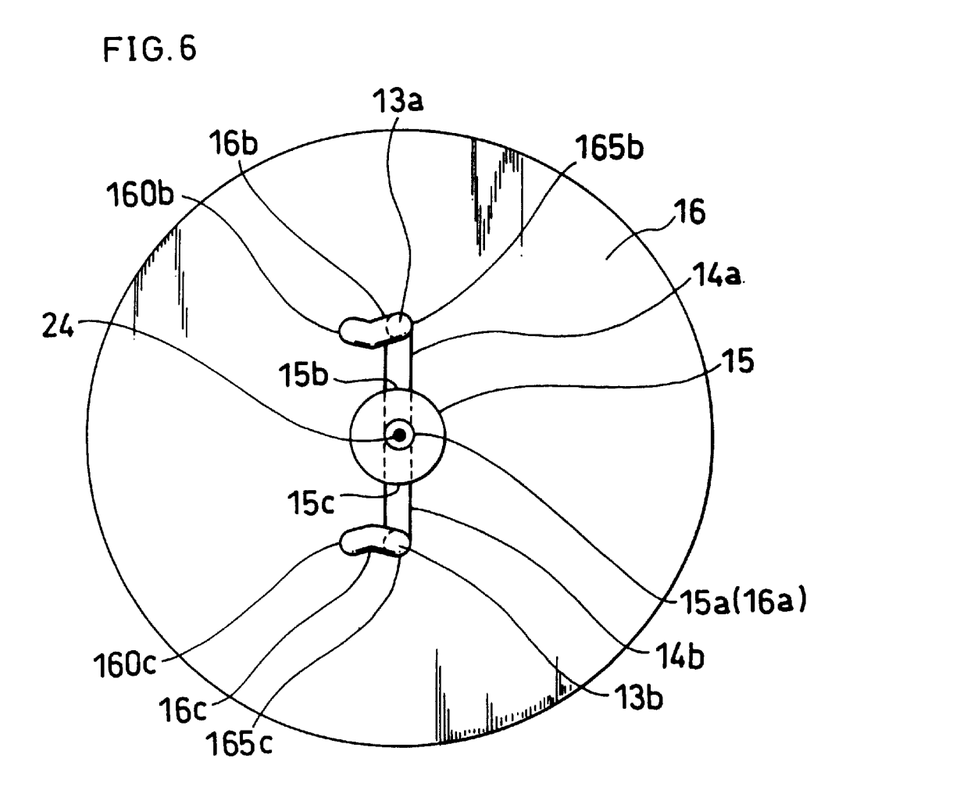
FIG. 6 is a plan view diagrammatically showing the single crystal holding means which forms part of the apparatus for pulling a single crystal according to the embodiment.

FIG. 3 is a longitudinal sectional view diagrammatically showing an apparatus for pulling a single crystal. FIG. 4 is a partial sectional side view diagrammaticallly showing a single crystal holding means which forms part of the apparatus for pulling a single crystal and the vicinity thereof. FIG. 5 is a sectional view along line V—V of FIG. 4, and FIG. 6 is a plan view diagrammatically showing the single crystal holding means.

The apparatus for pulling a single crystal 10 has a single crystal holding means 11 by which a single crystal 26 having an enlarged portion 26b and a reduced portion 26c under a neck 26a is pulled as the reduced portion 26c is held as shown in FIG. 3. The other parts thereof are the same as those of the apparatus for pulling a single crystal 30 shown in FIG. 1. Accordingly, only the single crystal holding means 11 and the parts related thereto are described.

The single crystal holding means 11 includes a fitting portion 12, arm portions 13a and 13b, supporting rods 14a and 14b, a supporting part 15, a disc 16 and guides 17, and is caused to wait in a prescribed position until the single crystal 26 is pulled to a prescribed position.

The guides 17 are arranged on both sides of the inner walls of the lower portion of a pull chamber 29a, and the disc 16 is placed on the guides 17. The disc 16 does not move downward from the guides 17, but can freely move upward. As shown in FIG. 6, the cylindrical supporting part 15 is fixed to the central portion of the disc 16, and in the central axis portions of the disc 16 and the supporting part 15, through holes 15a and 16a are formed, and are pierced by a pulling axis 24. In the supporting part 15, two through holes 15b and 15c are horizontally formed so as to pass through the central axis, which are pierced by two supporting rods 14a and 14b. To these two supporting rods 14a and 14b, the upper end portions of bar-shaped arm portions 13a and 13b which are located almost in parallel and have bending portions 130a and 130b at the lower ends thereof are screwed and fixed. To the bending portions 130a and 130b at the lower end of the arm portions 13a and 13b, the fitting portion 12 in the shape of a "V" in a plan view is fixed as shown in FIG. 5. The arm portions 13a and 13b pierce the slightly bent and slender through holes 16b and 16c formed in the disc 16. The through holes 16b and 16c have a bent shape in order to control the positions of the arm portions 13a and 13b. The arm portions 13a and 13b are formed in the shape widening slightly outward from the positions where the through holes 16b and 16c are formed, and can be temporarily fixed to the left end portions 16b and 16c thereof or the right end portions 165b and 165c thereof in FIG. 6. Before pulling the single crystal 26 and for a period of time from the beginning of the pulling, the arm portions 13a and 13b wait in the waiting positions of the end portions 160b and 160c as shown by virtual lines in FIG. 4. When the arm portions 13a and 13b hold the single crystal 26, they are transferred toward the end portions 165b and 165c by pushing inward a press part 18 forming part of a press means arranged at the lowest end of the pull chamber 29a and are located in the reduced portion fitting positions. Here, the press part 18 can advance with rotation in the horizontal plane in order to make it possible to press even the arm portions 13a and 13b which are rotated with the pulling axis 24. By the above operation, the fitting portion 12 fixed to the lower ends of the arm portions 13a and 13b is fitted to the reduced portion 26c formed in the single crystal 26 so that the single crystal 26 is held. Then, the single crystal holding means 11 is made to be one with a holder 24a, the pulling axis 24 and associated parts where the single crystal 26 is held, and ascends as the pulling axis 24 is pulled.

The holder 24a and associated parts can be freely rotated and be pulled in the same manner as those in the conventional apparatus for pulling a single crystal 30 (FIG. 1). The apparatus for pulling a single crystal 10 has an optical measuring means 19 for measuring the diameter of the single crystal 26 in order to control the diameter of the pulled single crystal 26.

The method for pulling a single crystal using the single crystal holding means 11 is described below. In the stage before the pulling of the single crystal 26, the single crystal holding means 11 is arranged within a chamber 29. The arm portions 13a and 13b are temporarily fixed to the end portions 160b and 160c of the through holes 16b and 16c of the disc 16 so as to be in waiting positions. The pulling axis 24 passes through the through hole 15a of the supporting part 15 and the through hole 16a of the disc 16, and the holder 24a holding a seed crystal 25 is suspended at the lower end of the pulling axis 24.

In the same manner as a conventional method, the seed crystal 25 is brought into contact with a melt 23 within a crucible 21, and a neck 26a is formed under the seed crystal 25. While the diameter is measured using the optical measuring means 19, the pulling speed of the pulling axis 24 is reduced so as to gradually increase the diameter, leading to the formation of an enlarged portion 26b under the neck 26a. The pulling axis 24 is pulled at a relatively high speed again, leading to the formation of a reduced portion 26c under the enlarged portion 26, and which has a smaller diameter than the enlarged portion 26b. Here, the reduced portion 26c is formed in the shape which makes it possible for the fusion ring to be observed at all times using the optical measuring means 19. That is, as shown in FIG. 3. the reduced portion 26c is formed so that an angle $\theta_s$, which is formed by a straight line forming the surface portion of the section of the reduced portion 26c and a horizontal plane, is larger than an angle $\theta_m$, which is made by the optical axis 19a of the optical measuring means 19 and a horizontal plane.

When the largest diameter of the enlarged portion 26b is $D_1$ and the length of the segments Z forming the section of the reduced portion 26c which are lengthened to cross each other is L, the reduced portion 26c may be formed so as to make $\tan \theta_s$ expressed by Formula 1 larger than $\tan \theta_m$. Formula 1:

$$L/0.5D_1 = 2L/D_1 = \tan \theta_s.$$

Since the fusion ring can be observed at all times during the formation of the reduced portion 26c by forming the reduced portion 26c having the above shape, the diameter thereof can be easily controlled. In addition, it is easy to cope with changes in the conditions such as the temperature of the melt 23, and dislocation can be prevented from being induced to the reduced portion 26c.

After forming the reduced portion 26c, a shoulder 26d is formed by gradually reducing the pulling speed, and a main body 26e having a uniform diameter is formed. When the holder 24a ascends to some extent, the holder 24a touches the disc 16 forming part of the single crystal holding means 11. Here, the length between the seed crystal 25 and the reduced portion 26c is controlled so that the fitting portion 12 is just fitted to the reduced portion 26c when the fitting portion 12 is transferred to the reduced portion fitting position. Accordingly, when arm portions 13a and 13b and the fitting portion 12 are transferred from the waiting positions to the reduced portion fitting positions, the fitting portion 12 is fitted to the reduced portion 26c so as to hold the single crystal 26. Even when the reduced portion 26c slightly slips out of place, the reduced portion 26c can be held certainly since the fitting portion 12 has a "V" shape.

The holder 24a, pulling axis 24, and associated parts are made to be one with the single crystal holding means 11. As the pulling axis 24 is pulled, the single crystal holding means 11 ascends at the same speed. By rotating the pulling axis 24, the single crystal holding means 11 also rotates at the same speed. Therefore, the single crystal 26 may be pulled with the same conditions as those in the conventional case. In the pulling, since the single crystal 26 is held by the single crystal holding means 11, even a heavy single crystal 26 can be easily pulled without occurrence of troubles such as breakage. Even when the neck 26a breaks for some reason, the single crystal 26 does not fall since the single crystal 26 is held by the single crystal holding means 11, and the pulling thereof can be continued safely in its original condition.

As described above, since the holder 24a and associated parts and the single crystal holding means 11 are made to be in one piece after the holder 24a touches the disc 16, the ascent/descent speed and the number of revolutions are synchronized without any other operation. As a result, there is no possibility that the central axis of the pulling axis 24 is off that of the single crystal holding means 11. Since the structure of the single crystal holding means 11 is relatively simple, troubles are not easily caused even in a high temperature atmosphere.

EXAMPLES AND COMPARATIVE EXAMPLES

The method of pulling a single crystal according to the invention are described below in the Examples. As a comparison, the case wherein the diameter of the reduced portion is drastically reduced using the same apparatus for pulling a single crystal as those used in Examples are described below in the Comparative Examples using the apparatus for pulling a single crystal 10 shown in FIGS. 3–6.

Example 1 and Comparative Example 1
(Common conditions to Example 1 and Comparative Example 1)

TABLE 1

Dimension and weight of single crystal

| Sort of single crystal | Diameter (mm) | Length (mm) under shoulder | Weight (kg) | Material weight (kg) | Number of pulls (times) |
| --- | --- | --- | --- | --- | --- |
| P-type silicon | 300 (12 in) | 1200 | 210 | 250 | 30 |

TABLE 2

| Revolution speed (rpm) | | Conditions in chamber | |
| --- | --- | --- | --- |
| Crystal | Crucible | Flow of Ar (liter/min) | Pressure (Pa) |
| 10 | 8 | 50 | 1330 |

TABLE 3

| Dimension of quartz crucible | | Dimension of heater | | |
| --- | --- | --- | --- | --- |
| Diameter (mm) | Height (mm) | Inner diameter (mm) | Outer diameter (mm) | Height (mm) |
| 750 | 470 | 800 | 850 | 600 |

TABLE 4

| Dimension of heat insulating mold | | Dimension of chamber | |
| --- | --- | --- | --- |
| Diameter (mm) | Height (mm) | Inner diameter (mm) | Height (mm) |
| 900 | 1300 | 1350 | 1200 |

(Different conditions between Example 1 and Comparative Example 1)

TABLE 5

Dimension of each part of single crystal

| | Neck | | Enlarged portion Largest | | Reduced portion Smallest | |
| --- | --- | --- | --- | --- | --- | --- |
| | Diameter (mm) | Height (mm) | diameter (mm) | Height (mm) | diameter (mm) | Height (mm) |
| Example 1 | 3 | 150 | 40 | 40 | 10 | 50 |
| Comparative Example 1 | 3 | 150 | 40 | 40 | 10 | 20 |

The reduced portion 26c formed in Example 1 had a largest diameter $D_1$, of 40 mm, a smallest diameter $D_2$ of 10 mm, and a height of 50 mm as shown in Table 5. Accordingly, the length L was 66.7 mm, and according to Formula 1, $\tan \theta_s$ was 3.35, which was larger than 2.144, the tangent ($\tan \theta_m$) of the angle which was made by the optical axis 19a of the optical measuring means 19 and a horizontal plane. As a result, during the formation of the reduced portion 26c, the diameter thereof could be measured through the fusion ring and could be controlled. Therefore, the single crystal 26 having no fault or the like could be pulled, without induction of dislocation to the single crystal 26. Here, the fitting portion 12 was fitted to the reduced portion 26c just after the holder 24a touched the disc 16. Then, the single crystal 26 was pulled where the holder 24a and associated parts were made to be one with the single crystal holding means 11. The neck 26a did not break in pulling and taking out the single crystal 26, so that the pulling could be safely performed. Furthermore, even when the neck 26a of the pulled single crystal 26 was artificially broken, the single crystal 26 did not fall. Thus, it was ascertained that the single crystal 26 was certainly held by the single crystal holding means 11.

On the other hand, in Comparative Example 1, the diameter of the reduced portion 26c was drastically reduced by increasing the pulling speed after forming the enlarged portion 26. By the above operation, the reduced portion 26c having a largest diameter $D_1$, of 40 mm, a smallest diameter $D_2$ of 10 mm, and L of 20 mm was formed. Therefore, the length L was 26.7 mm, and according to Formula 1, $\tan \theta_s$ was 1.34, which was smaller than $\tan \theta_m$ of 2.144. Thus, during the formation of the reduced portion 26c, the diameter thereof could not be measured by measuring the fusion ring using the optical measuring means 19 and could not be appropriately controlled. As a result, dislocation was induced to the pulled single crystals at a rate of 40%.

Figure 7:
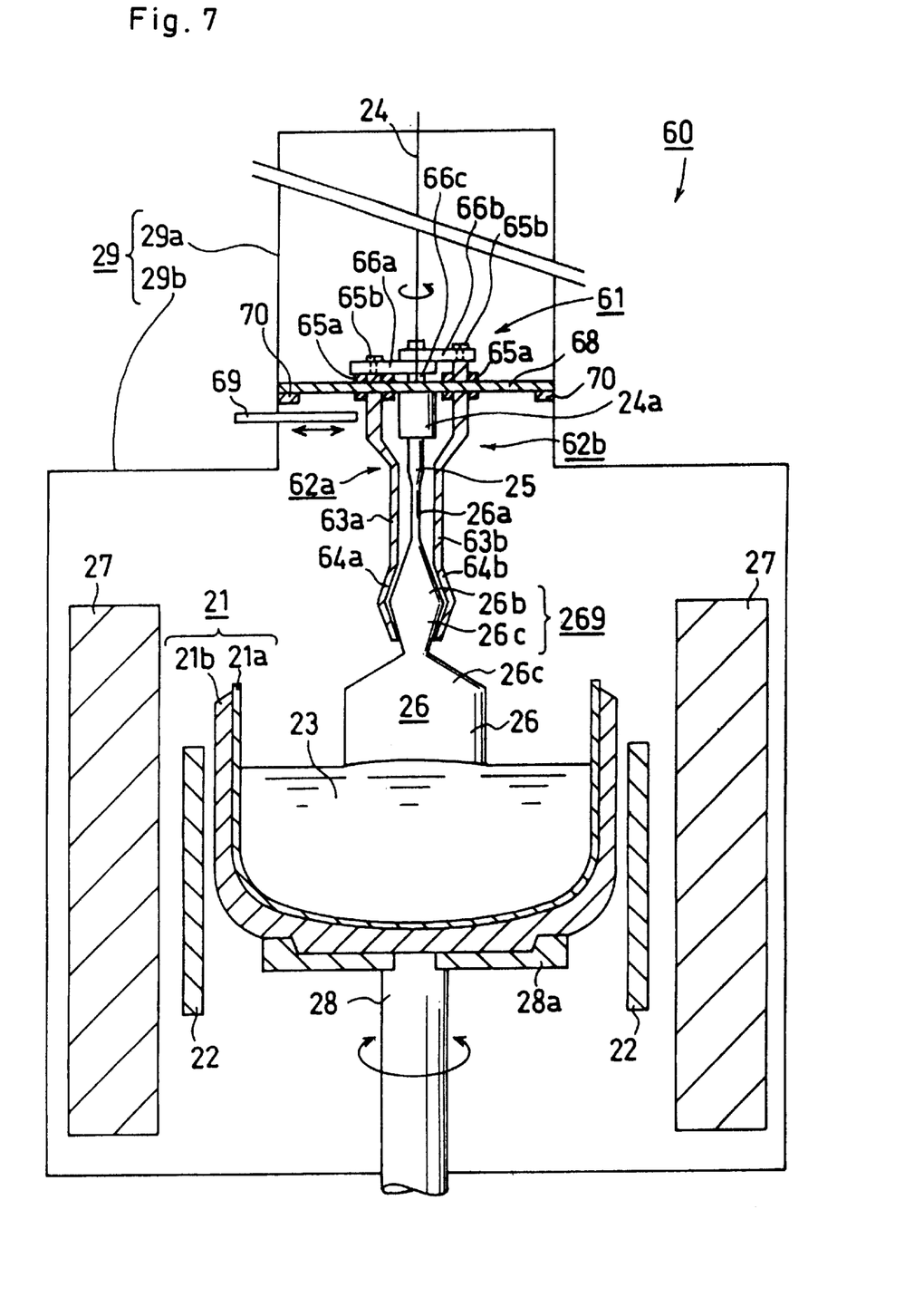
FIG. 7 is a longitudinal sectional view diagrammatically showing an apparatus for pulling a single crystal according to another embodiment of the present invention.
Figure 8:
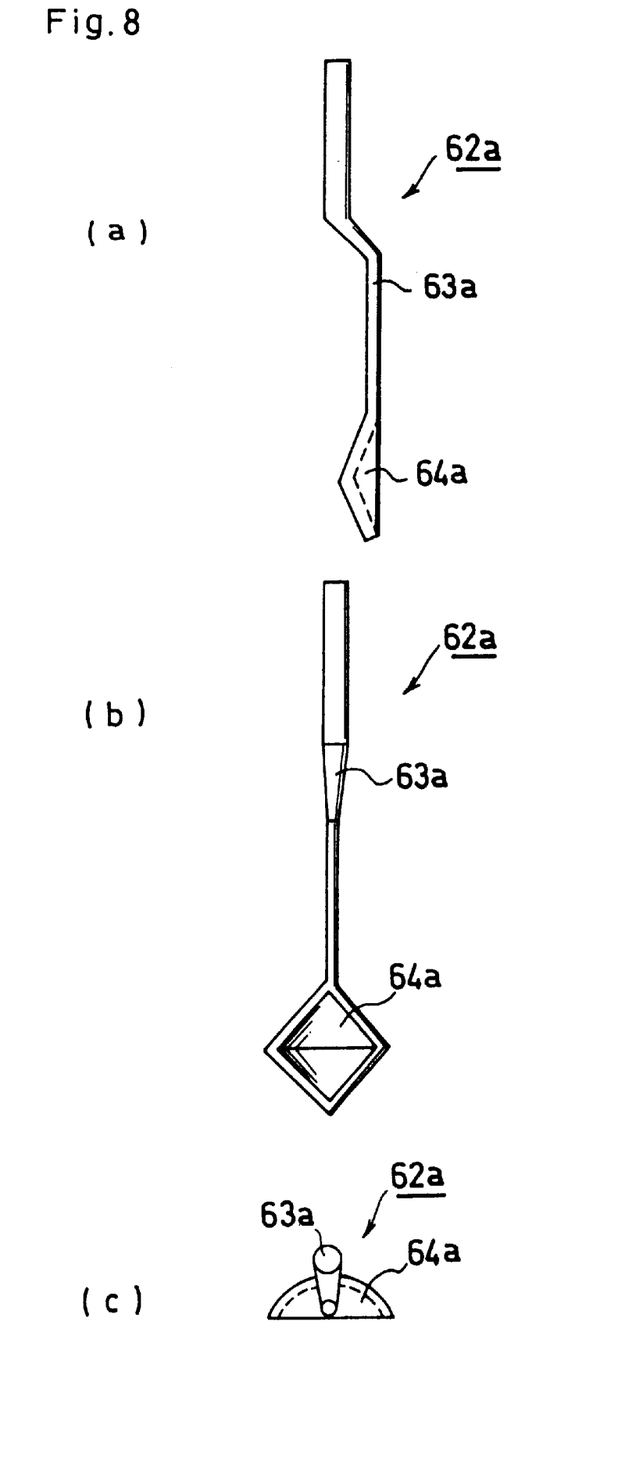
FIG. 8(a) is a front view diagrammatically showing a grasping part which forms part of a single crystal holding means in the apparatus for pulling a single crystal according to the embodiment.
FIG. 8(b) is a side view thereof.
FIG. 8(c) is a plan view thereof.
Figure 9:
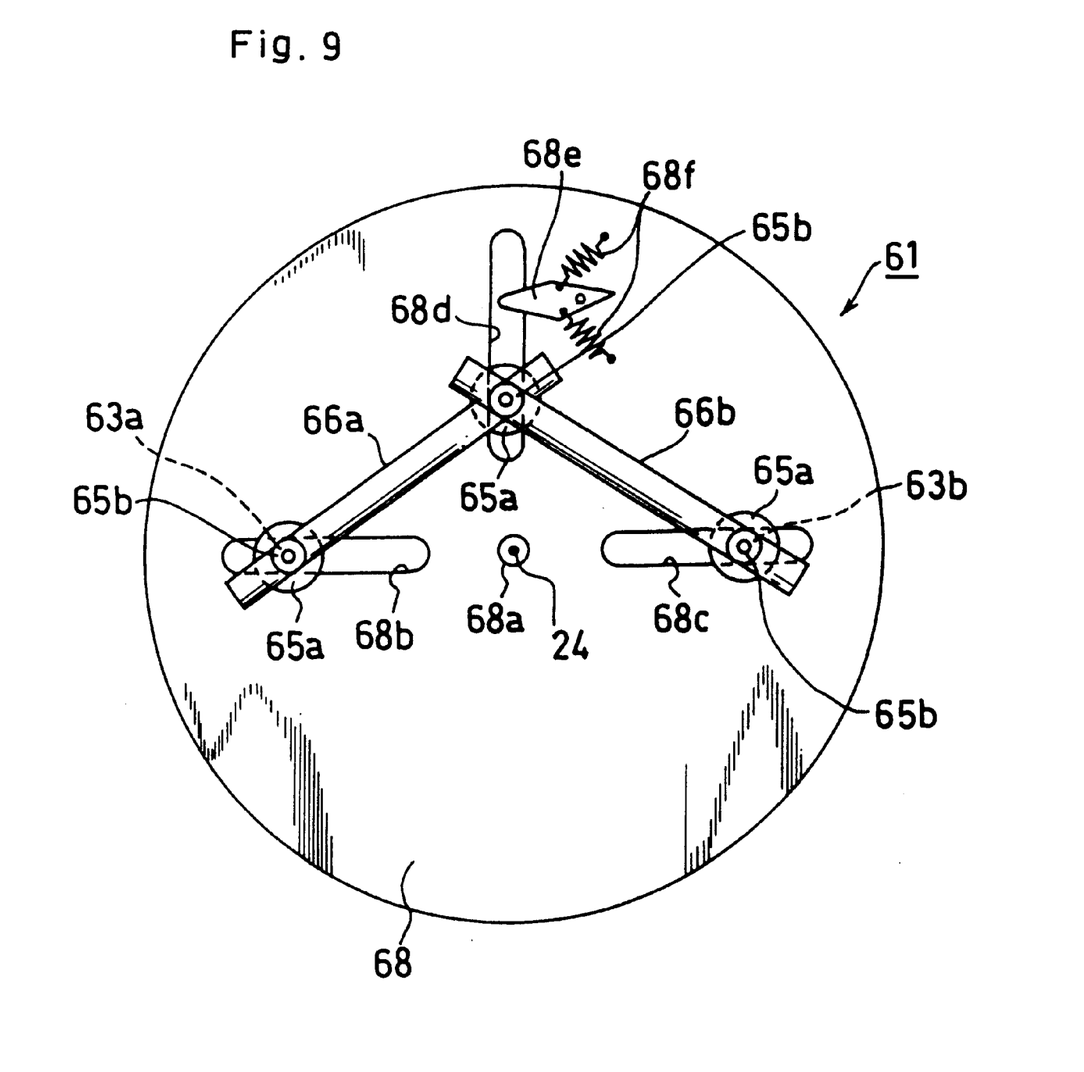
FIG. 9 is a plan view diagrammatically showing the single crystal holding means which forms part of the apparatus for pulling a single crystal according to the embodiment.

FIG. 7 is a longitudinal sectional view diagrammatically showing another apparatus for pulling a single crystal, FIG. 8(*a*) is a front view diagrammatically showing a grasping part which forms part of a single crystal holding means. FIG. 8(*b*) is a side view of the holding means, and FIG. 8(*c*) is a plan view of the holding means. FIG. 9 is a plan view diagrammatically showing the above single crystal holding means.

The apparatus for pulling a single crystal 60 has a single crystal holding means 61, by which a single crystal 26 having a fitting portion 26g comprising an enlarged portion 26b and a reduced portion 26c under a neck 26a is pulled as the fitting portion 26g is grasped, as shown in FIG. 7.

The single crystal holding means 61, including grasping parts 62a and 62b, a grasping part supporting disc 68, connecting parts 66a and 66b, and auxiliary supporting parts 65a, waits in a prescribed position until the single crystal is pulled to a prescribed position.

Guides 70 are arranged on both sides of the inner walls of the lower portion of a pull chamber 29a, and the grasping part supporting disc 68 is placed on the guides 70. The grasping part supporting disc 68 does not move downward from the guides 70 but can freely move upward. As shown in FIG. 9, a through hole 68a is formed in the central axis portion of the grasping part supporting disc 68, which a pulling axis 24 passes through. On both sides of the through hole 68a, through holes 68b and 68c (which are slender in the transverse direction) are formed symmetrically to the pulling axis 24. A through hole 68d which is slender in the vertical direction is formed perpendicularly to the line connecting the central axes in the transverse direction of the through holes 68b and 68c.

The upper portions of arm portions 63a and 63b forming part of the grasping parts 62a and 62b pass through the through holes 68b and 68c, and the grasping parts 62a and 62b are supported by the auxiliary supporting parts 65a which are arranged on the arm portions 63a and 63b to support the arm portions 63a and 63b as if to put the grasping part supporting disc 68 between the upper and lower sides. The arm portions 63a and 63b can freely move right and left where they are supported by the auxiliary supporting parts 65a. The grasping part 62a has a grasping portion 64a in the lower portion thereof whose inner shape almost corresponds to the external shape of the fitting portion 26g as shown in FIG. 8. Thus, the fitting portion 26g is grasped as if to be wrapped by the pair of grasping parts 62a and 62b arranged on both sides of the fitting portion 26g.

To the upper end of the arm portion 63a or 63b forming part of the grasping part 62a or 62b, one end portion of a bar-shaped connecting part 66a or 66b is fitted with a screw 65b so as to be rotatable. The other ends of both the connecting parts 66a and 66b are fitted to a connecting part supporting rod 66c (FIG. 7), which is fitted to the through hole 68d so as to be rotatable, and are connected. The connecting part supporting rod 66c can move freely inside the through hole 68d.

Accordingly, when the arm portion 63a forming part of the grasping part 62a is transferred toward the pulling axis 24, the connecting part supporting rod 66c moves outward inside the through hole 68d. This makes the arm portion 63b move toward the pulling axis 24 inside the through hole 68c. The through holes 68b and 68c are formed symmetrically with respect to the central axis, the connecting parts 66a and 66b are arranged symmetrically with respect to the line connecting the pulling axis 24 and the central axis of the through hole 68d, and the arm portions 63a and 63b are composed so as to always move symmetrically with respect to the pulling axis 24.

Before pulling the single crystal 26 and for a period of time from the beginning of the pulling thereof, the arm portions 63a and 63b wait in the left and right end portions of the through holes 68b and 68c (waiting positions). When it is necessary to hold the single crystal 26, by pushing inward a press part 69 forming part of a press means arranged in the lower portion of the pull chamber 29a, the arm portions 63a and 63b are transferred to the end portions close to the pulling axis 24 of the through holes 68b and 68c, which are the fitting portion grasping positions. At that time, the connecting part supporting rod 66c moves outward in the through hole 68d and when it reaches the outside end portion, a fixing part 68e fitted to springs 68f functions. Therefore, the connecting part supporting rod 66c is fixed and the arm portions 63a and 63b are also fixed.

By the above operation, the single crystal 26 is held by grasping the fitting portion 26g formed in the single crystal 26 as if to wrap it from both sides by the grasping portions 64a and 64b arranged at the lower ends of the arm portions 63a and 63b. Then, the single crystal holding means 61 is made to move as one piece with the holder 24a, pulling axis 24, and associated parts where the single crystal 26 is held, and ascends as the pulling axis 24 is pulled.

A method for pulling a single crystal using the single crystal holding means 61 is described below. In the stage before the pulling of the single crystal 26, the single crystal holding means 61 is arranged in a chamber 29, and the arm portions 63a and 63b are located in the left and right end portions of the through holes 68b and 68c (waiting positions). The pulling axis 24 passes through the through hole 68a of the grasping part supporting disc 68, and at the lower end of the pulling axis 24, the holder 24a holding the seed crystal 25 is suspended. The holder 24a and associated parts can be freely rotated and pulled in the same manner as those in the conventional apparatus for pulling a single crystal 30 (FIG. 1).

The seed crystal 25 is brought into contact with the melt 23 filling the crucible 21 so as to form the neck 26a under the seed crystal 25. By reducing the pulling speed of the pulling axis 24, the diameter is gradually increased so as to form the enlarged portion 26b under the neck 26a. Consecutively, by pulling the pulling axis 24 at a relatively high speed again, the diameter is gradually reduced so as to form the reduced portion 26c.

After forming the enlarged portion 26b and reduced portion 26c (fitting portion 26g), by reducing the pulling speed gradually, the shoulder 26d is formed, and the main body 26e having a uniform diameter is formed. When the holder 24a ascends to some extent, the holder 24a touches the grasping part supporting disc 68 which forms part of the single crystal holding means 61. At that time, the length from the seed crystal 25 to the fitting portion 26g is controlled so that by transferring the grasping portions 64a and 64b to the fitting portion grasping positions, the grasping portions 64a and 64b just grasp the fitting portion 26g. As a result, when the arm portions 63a and 63b, and the grasping portions 64a and 64b are transferred from the waiting positions to the fitting portion grasping positions using the press part 69, the grasping portions 64a and 64b grasp the fitting portion 26g, so that the single crystal 26 is held.

Then, the holder 24a, pulling axis 24, and associated parts are made to move as one piece with the single crystal holding means 61. As the pulling axis 24 is pulled, the single crystal holding means 61 ascends at the same speed. By rotating the pulling axis 24, the single crystal holding means 61 rotates at the same speed. Accordingly, then, the single crystal 26 may be pulled with the same conditions as those in a conventional method. In the pulling, since the single crystal 26 is held by the single crystal holding means 61, even a heavy single crystal 26 can be easily pulled without occurrence of troubles such as breakage. Even when the neck 26a breaks for some reason, the single crystal 26 does not fall since the single crystal 26 is held by the single crystal holding means 61, and the pulling can be continued safely in its original condition.

As described above, since the holder 24a and associated parts and the single crystal holding means 61 are made to move as one piece after the holder 24a touches the grasping part supporting disc 68, the ascent/descent speed and the number of revolutions are synchronized without any other operation. Thus, there is no possibility that the central axis of the pulling axis 24 is off that of the single crystal holding means 61. Since the structure of the single crystal holding means 61 is relatively simple, troublles are not easily caused even in a high temperature atmosphere.

Example 2

The single crystal 26 was pulled by the method described in the above embodiment. The conditions are shown in Tables 6–10.

TABLE 6

Dimension and weight of single crystal

| Sort of single crystal | Diameter (mm) | Length (mm) under shoulder | Weight (kg) | Material weight (kg) | Number of pulls (times) |
| --- | --- | --- | --- | --- | --- |
| P-type silicon | 300 (12 in) | 1200 | 210 | 250 | 30 |

TABLE 7

| Revolution speed (rpm) | | Conditions in chamber | |
| --- | --- | --- | --- |
| Crystal | Crucible | Flow of Ar (liter/min) | Pressure (Pa) |
| 10 | 8 | 50 | 1330 |

TABLE 8

| Dimension of quartz crucible | | Dimension of heater | | |
| --- | --- | --- | --- | --- |
| Diameter (mm) | Height (mm) | Inner diameter (mm) | Outer diameter (mm) | Height (mm) |
| 750 | 470 | 800 | 850 | 600 |

TABLE 9

| Dimension of heat insulating mould | | Dimension of chamber | |
| --- | --- | --- | --- |
| Diameter (mm) | Height (mm) | Inner diameter (mm) | Height (mm) |
| 900 | 1300 | 1350 | 1200 |

TABLE 10

Dimension of each part of single crystal

| Neck | | Enlarged portion | | Reduced portion | |
| --- | --- | --- | --- | --- | --- |
| | | Largest | | Smallest | |
| Diameter (mm) | Height (mm) | diameter (mm) | Height (mm) | diameter (mm) | Height (mm) |
| 3 | 100 | 40 | 30 | 10 | 50 |

Results of Example 2

The neck 26a did not break in pulling and taking out the single crystal 26, so that the pulling could be safely performed. When the neck 26a of the pulled single crystal 26 was artificially broken, the single crystal 26 did not fall. Thus, it was ascertained that the single crystal 26 was certainly held by the single crystal holding means 11.

Industrial Applicability

The method and the apparatus for pulling a single crystal according to the present invention are effective in safely and efficiently manufacturing a single crystal to which dislocation is not induced.

What is claimed is:

1. A method of pulling a single crystal, comprising:

dipping a seed crystal into a melt within a crucible;

pulling the dipped seed crystal at a controlled rate so as to control a size of a diameter of the single crystal;

forming a neck of the single crystal under the dipped seed crystal by rotating the dipped seed crystal as the dipped seed crystal is pulled;

gradually increasing the diameter of the single crystal after said forming of the neck so as to form an enlarged portion of the single crystal having a gradually increasing diameter;

gradually reducing the diameter of the single crystal after said gradual increasing of the diameter so as to form a reduced portion of the single crystal having a gradually decreasing diameter; and measuring the diameter of the single crystal at the interface between the melt and the single crystal by using an optical measuring device arranged above the crucible, wherein the optical measuring device is arranged above the crucible such that the optical axis and a horizontal plane form an angle $\theta_m$;

wherein said gradually reducing the diameter of the single crystal comprises measuring the diameter of the reduced portion at all times using the optical measuring device, and comprises reducing the diameter such that a straight line along a surface of the reduced portion and a horizontal plane form an angle $\theta_s$, whereby $\theta_s$ is greater than $\theta_m$.

2. The method of claim 1, wherein said gradually increasing the diameter of the single crystal comprises pulling the seed crystal at a gradually decreasing rate.

3. The method of claim 2, wherein said gradually reducing the diameter of the single crystal comprises pulling the seed crystal at a gradually increasing rate.

4. The method of claim 1, wherein said gradually reducing the diameter of the single crystal comprises pulling the seed crystal at a gradually increasing rate.

* * * * *